US006627522B2

(12) United States Patent
Sadigh et al.

(10) Patent No.: US 6,627,522 B2
(45) Date of Patent: Sep. 30, 2003

(54) METHOD FOR ENHANCING THE SOLUBILITY OF DOPANTS IN SILICON

(75) Inventors: Babak Sadigh, Oakland, CA (US); Thomas J. Lenosky, Santa Clara, CA (US); Tomas Diaz De La Rubia, Danville, CA (US)

(73) Assignee: The Regents of the University of California, Oakland, CA (US)

( * ) Notice: Subject to any disclaimer, the term of this patent is extended or adjusted under 35 U.S.C. 154(b) by 85 days.

(21) Appl. No.: 09/945,878

(22) Filed: Sep. 4, 2001

(65) Prior Publication Data

US 2003/0042576 A1 Mar. 6, 2003

Related U.S. Application Data

(63) Continuation-in-part of application No. 09/945,932, filed on Sep. 4, 2001, now Pat. No. 6,498,078.

(51) Int. Cl.$^7$ .............................................. H01L 21/04
(52) U.S. Cl. ...................... 438/510; 438/514; 438/542
(58) Field of Search ................................. 438/510–589

(56) References Cited

PUBLICATIONS

Yang et al., Evidence for Substitutional C, Ordering Effects and Interdiffusion in EpitaxialGe–C and Ge Rich Ge–Si–C Alloys, Materials Research Society Symposium, 1998, Apr. 13, pp. 361–366.*
Babak Sadigh et al. Phys. Rev. Letters vol. 83 No. 21, Nov.1999, pp. 4341–4344.
P.M. Fahey et al, Rev. Mod. Physics, vol. 61, No. 2, Apr. 1989, pp. 289–384.
Paul A. Packan, Science vol. 25 Sep. 1999, pp. 2079–2081.
W. Kohn et al, Physical Review, vol. 149, No. 4A Nov. 1965 pp. A1133–A1138.
Ecole Normale Supericure et al, Physical Review, vol. 136, No. 3B, Nov. 1964, pp. B864–B871.

* cited by examiner

*Primary Examiner*—Douglas A. Wille
(74) *Attorney, Agent, or Firm*—L. E. Carnahan; Alan H. Thompson

(57) ABSTRACT

A method for enhancing the equilibrium solid solubility of dopants in silicon, germanium and silicon-germanium alloys. The method involves subjecting silicon-based substrate to biaxial or compression strain. It has been determined that boron solubility was largely enhanced (more than 100%) by a compressive bi-axial strain, based on a size-mismatch theory since the boron atoms are smaller than the silicon atoms. It has been found that the large enhancement or mixing properties of dopants in silicon and germanium substrates is primarily governed by their, and to second order by their size-mismatch with the substrate. Further, it has been determined that the dopant solubility enhancement with strain is most effective when the charge and the size-mismatch of the impurity favor the same type of strain. Thus, the solid solubility of small p-type (e.g., boron) as well as large n-type (e.g., arsenic) dopants can be raised most dramatically by appropriate bi-axial (compressive) strain, and that solubility of a large p-type dopant (e.g, indium) in silicon will be raised due to size-mismatch with silicon, which favors tensile strain, while its negative charge prefers compressive strain, and thus the two effects counteract each other.

10 Claims, 2 Drawing Sheets

METHOD FOR ENHANCING THE SOLUBILITY OF DOPANTS IN SILICON

RELATED APPLICATION

This application relates to and is a Continuation-In-Part of U.S. application Ser. No. 09/945,932, filed Sep. 4, 2001, now U.S. Pat. No. 6,498,078, entitled "A Method for Enhancing the Solubility of Boron and Indium in Silicon", and assigned to the same assignee.

The United States Government has rights in this invention pursuant to Contract No. W-7405-ENG48 between the United States Department of Energy and the University of California for the operation of Lawrence Livermore National Laboratory.

BACKGROUND OF THE INVENTION

The present invention relates to improving the solubility of dopants in silicon (Si), germanium (Ge), and silicon-germanium alloys ($Si_xGe_{1-x}$) and particularly to enhancing solubility of dopants by subjecting the silicon based substrate to an appropriate strain, and more particularly to a method of enhancing solubility of dopants in silicon wherein the type of strain (compressive or tensile) is governed by the dopant's charge and its size-mismatch with the Si-based substrate.

Ion implantation allows for exceptional control and reproducibility in the introduction of dopants into the near-surface region of semiconductors. As a result, it has been the universal method of choice for doping MOS transistors in silicon-based integrated circuits since the beginning of the semiconductor revolution. However, an undesirable effect of ion-implantation is that it introduces significant damage into the silicon wafer in the form of point defects and their clusters, Fahey et al. Rev. Mod. Phys. 61, 289 (1989). For a device to be operational these defects must be removed and the dopants electrically activated through high-temperature annealing. The annealing procedure leads to unwanted dopant diffusion, as well as nucleation and growth of dopant clusters and precipitates which results in incomplete activation.

Experience has shown that the solubility of boron in silicon under non-equilibrium thermodynamic conditions that prevail during the annealing procedure, i.e., in the presence of excess silicon self-interstitial atoms, is lower than its equilibrium thermodynamic value. The latter thus determines an upper bound for the concentration of substitutional B atoms in silicon. As technology continues to evolve toward smaller and faster transistors, this limit may soon be reached unless new ideas and/or technologies are brought forward that can reduce dopant diffusion during processing while at the same time increasing their electrical activity, see *Packan,* Science 285,2079 (1999).

The most widely used p-type dopant, i.e., boron, has a maximum solubility of less than 1 at. % in silicon at the annealing temperature of interest. This sets the limit for the highest concentration of electrically active boron impurities that can be reached with current implantation techniques. Already the next generation of transistors will be dangerously dose to this solubility limit. Another p-type dopant candidate with excellent diffusion properties, i.e., indium, has been used only on a small scale mainly because of its very low solubility in silicon. Thus, there is a need to remedy this acute problem faced by the semiconductor industry.

Recently the invention described and claimed in the above-referenced copending U.S. Application provides a solution to the above-referenced problem by a method for enhancing the solubility of boron and indium in silicon. That invention, like the present invention is based on the use of first-principles density-functional theory (DFT) in the local-density approximation (LDA) to calculate the temperature dependence of the equilibrium solubility of boron in crystalline silicon under various strain conditions. Verification of the above-referenced invention has shown that the equilibrium thermodynamic solubility of significantly size-mismatched dopants in silicon, such as boron or indium, can be raised by more than 100% if the silicon substrate is strained appropriately.

The present invention constitutes an improvement over the method described and claimed in the above-references copending Application. In this invention, it has been determined that the mixing properties of dopants in silicon (Si), germanium (Ge), and silicon-germanium alloys ($Si_xGe_{1-x}$) are primarily governed by their charge and to a second order by their size-mismatch with the silicon-based substrate, as in the method of the above-reference application. Therefore, the solubility of small p-type (e.g., boron), as well as large n-type (e.g., arsenic), dopants can be raised most effectively by appropriate bi-axial strain, i.e. compression for the former, and tensile strain for the latter. Thus, while quantum mechanical calculations have shown an unexpectedly large increase on the order of 100%—in the solubility of boron in silicon upon only 1% compression (bi-axial) strain of the <100> layers, this large enhancement has been found mostly due to the negative charge of the boron impurities in silicon, than boron's previously considered size-mismatch with silicon.

SUMMARY OF THE INVENTION

It is an object of the present invention to increase the solubility of dopants in semiconductor substrate materials.

A further object of the invention is to provide a method for enhancing the solubility of dopants in silicon, germanium and silicon germanium alloys.

A further object of the invention is to provide a method whereby solubility of small size-mismatch p-type (e.g, boron) as well as large size-mismatch n-type (e.g., arsenic) dopants can be raised effectively by appropriate bi-axial strain.

Another object of the invention is to provide a method for enhancing the solubility of dopants in silicon, germanium and silicon germanium alloys utilizing both the charge of the dopant and its size-mismatch with the silicon based substrate to determine the appropriate strain to be applied to the silicon based substrate.

Another object of the invention is to increase solubility of boron and arsenic by appropriate bi-axial strain based on their charge and size-mismatch with silicon and germanium.

Another object of the invention is to provide a method for enhancing the solubility of dopants in silicon which takes into account the electronic structure of silicon due to which negatively charged impurities become more soluble under compressive strain while positively charged dopants prefer tensile strain.

Another object of the invention is to provide a method for enhancing the solubility of dopants in silicon utilizing strain based on the electronic structure of the dopant and the silicon, and the size-mismatch between the dopant and the silicon.

Other objects and advantages of the invention will become apparent from the description and accompanying drawings. The present invention is directed to enhancing the solubility of dopants in silicon, germanium and silicon germanium alloys. Prior quantum mechanical calculations, see above-referenced copending application, have shown an unexpectedly large increase on the order of 100%—in the solubility of boron in silicon upon only 1% compression of the <100> silicon layers. This large enhancement was previously considered as being caused by the size-mismatch between boron and silicon atoms, boron being smaller. It has now been discovered that this large enhancement is, however, mostly due to the negative charge of the boron impurities in silicon. This charge arises as a result of the electronic structure of silicon due to which negatively charged impurities become more soluble under compression strain while positively charged dopants become more soluble under tensile strain. This finding can be extended to the case of dopants in Ge as well as silicon germanium alloys. Thus, it has been determined that the mixing properties of dopants in silicon, germanium and silicon-germanium alloys are primarily governed by their charge, and to second order by their size-mismatch with silicon. Thus, it has been established by this invention that the solubility of small p-type (e.g., boron) as well as large n-type (e.g., arsenic) dopants can be raised most effectively by appropriate bi-axial strain. It has also been determined that for large p-type dopants, such as indium, this effect is significantly reduced due to the competition from the charge and the size-mismatch which favor opposite strain types.

BRIEF DESCRIPTION OF THE DRAWINGS

The accompanying drawings, which are incorporated into and form a part of the disclosure, illustrate the method of the invention and, together with the description, serve to explain the principles of the invention.

DETAILED DESCRIPTION OF THE INVENTION

Figure 1:
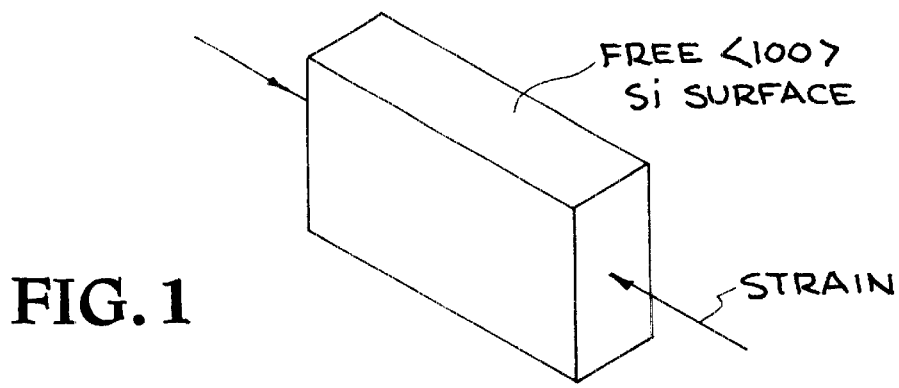
FIG. 1 illustrates a compressive bi-axial strain induced in a <100> silicon substrate.

The present invention is directed to the enhancement of the solubility of dopants, such as boron (B) in semiconductor materials, such as silicon (Si), germanium (Ge) and silicon germanium alloys ($Si_xGe_{1-x}$). The method for carrying out this invention takes into account the electronic structure of the dopant and the semiconductor materials. It has been found that the large enhancement (100%) of solubility of B in Si upon only 1% compression of the <100> silicon layers, as described and claimed in the above-reference copending application, was mostly due to the negative charge of the B impurities in Si, and not due to the size-mismatch with Si as previously understood. Thus, this invention is an improvement over that of the above-referenced application, and the method of this invention is based on the mixing properties of dopants in Si, Ge, and $Si_xGe_{1-x}$ alloys, which are governed primarily by their charge, and to a second order by their size-mismatch with Si-based substrate. This enhancement of solubility in dopants such as B is mostly due to the negative charge of the B impurities, and it arises as a result of the electronic structure of Si and Ge due to which negatively charged impurities become more soluble under compressive strain while positively charged dopants become more soluble under tensile strain. Therefore, via the present invention, the solubility of small p-type (e.g., B) as well as large n-type, e.g., arsenic (As) dopants can be raised most effectively by appropriate bi-axial strain. It has also been determined by this method that for large size-mismatched p-type dopants, such as indium (In) this solubility increase is significantly reduced due to the competition between the charge and the size-mismatch which in this case favor opposite strain types.

As pointed out above, we have previously presented quantum mechanical calculations of the equilibrium solid solubility of B and In in Si under bi-axial strain, represented by a small perturbation of the lattice constant of the Si <100> layers, while allowing the interlayer spacing to relax due to the Poisson effect. Based on a size-mismatch argument, previously the B solubility was expected to be enhanced by a compressive bi-axial strain, since the B atoms are smaller than the Si atoms. Conversely, In solubility should be raised via tensile strain, due to its large atom size compared to Si. Our previous calculations confirmed the above, but a surprisingly large enhancement (more than 100%) was found upon 1% strain, for both B and In.

We have now performed more accurate calculations and deeper analysis, and we can now explain the large enhancements observed previously. Furthermore, the conclusions reached previously are somewhat modified as a result of this further development. Previously we set forth the following expression for maximum soluble B concentration in Si ($[B]_{max}$):

$$[B]_{max} \sqrt{n(T)} \exp(\Delta H/2k_BT) - E_{gap}/(4k_BT)) \quad (1)$$

Here n(T) is the intrinsic carrier concentration in Si, $k_B$ is the Boltzmann constant, T is the temperature and $E_{gap}$ is the electronic band-gap in Si. The enthalpy of solution ($\Delta H$) is however derived to be:

$$\Delta H = \Delta H^- - E_{midgap} = 4/3(E(SiB_3) - E(Si)) - (E(B^-) - E_{midgap} - E(Si)), \quad (2)$$

where $E(SiB_3)$ and $E(Si)$ denote the total energies per atom for the $SiB_3$ and pure Si phases respectively. Furthermore E ($B^-$) is the energy of an isolated negatively charged substitutional B impurity and $E_{midgap}$ is the energy level at mid-gap.

It turns out that the largest contribution to the B solubility enhancement comes from the strain dependence of the $E_{midgap}$, which increases linearly with compressive strain, and decreases with tensile strain. This is an intrinsic property of Si and is present for all charged impurities. However, for positively charged dopants (e.g. arsenic), Eq. 2 becomes $$\Delta H = \Delta H^+ + E_{midgap}. \quad (3)$$

The positive sign above and the linear dependence of $E_{midgap}$ upon strain imply that the dramatic solubility enhancement observed in B (negatively charged dopant) upon compressive strain, will take place under tensile strain for a positively charged dopant such as As.

In summary, it has been determined that the mixing properties of dopants in Si, Ge, and $Si_xGe_{1-x}$ alloys are primarily governed by their charge, and to second order by their size-mismatch with Si-based substrate. However, the dopant solubility enhancement with strain is most effective when the charge and the sized-mismatch of the impurity favor the same type of strain. Hence, the solid solubility of small p-type (e.g., B) as well as large n-type (e.g., As) dopants can be raised most dramatically by appropriate bi-axial strain as shown in FIG. 1. Following this argument, large p-type dopant such as In, will have a more complicated behavior than was stated earlier. Due to size-mismatch with Si, it favors tensile strain, while its negative charge prefers compressive strain. The two effects thus counteract each other.

Figure 2A:
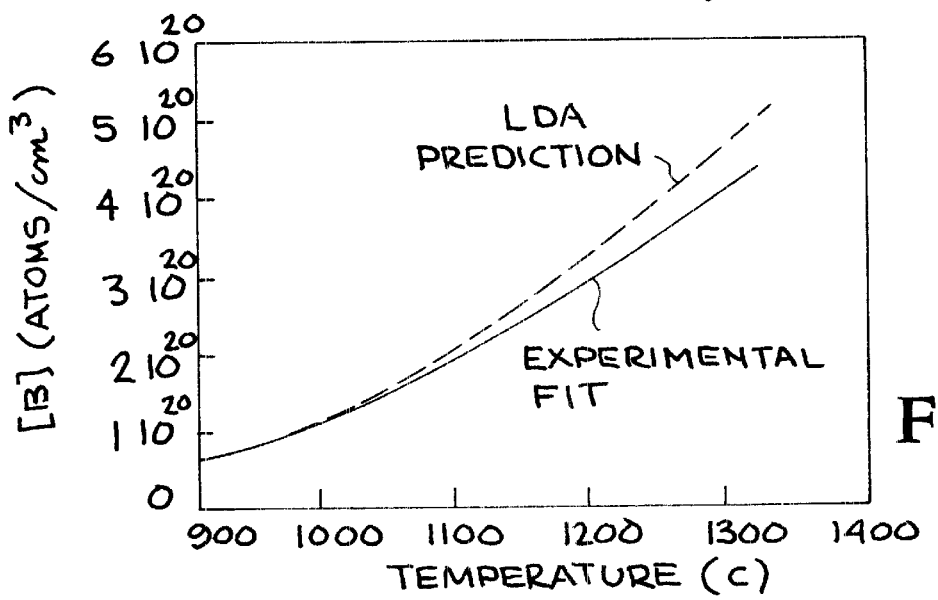
FIGS. 2A and 2B graphically illustrate boron solubility versus temperature.
Figure 2B:
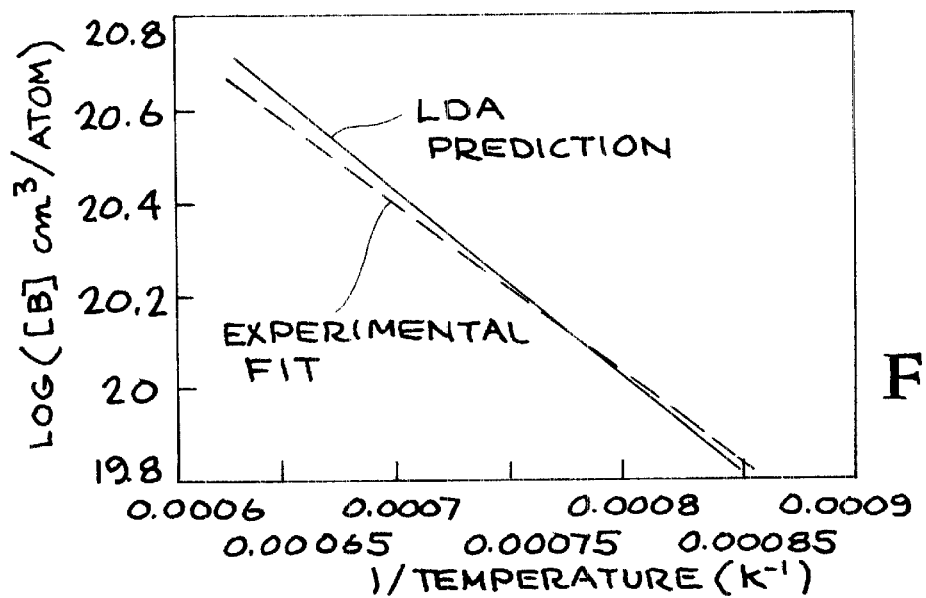

Boron solubility versus temperature is shown in FIGS. 2A and 2B involving the use of first principles density-function theory in the local density approximation (LDA) prediction and an experimental fit, wherein $[B]=Ae^{E/kT}$ wherein E(experimental fit)=−0.73+/−−0.0.4 eV, and E (first principles or LDA fit)=−0.80 eV.

Figure 3:
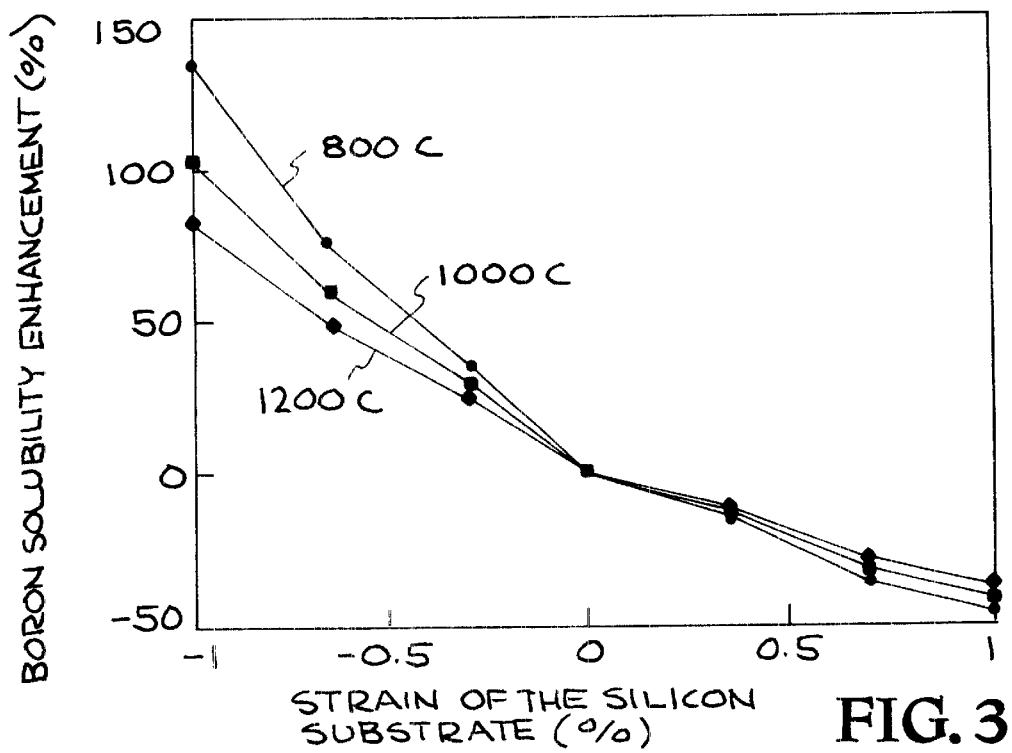
FIG. 3 graphically illustrates boron solubility enhancement at 800° to 1200° C.
Figure 4:
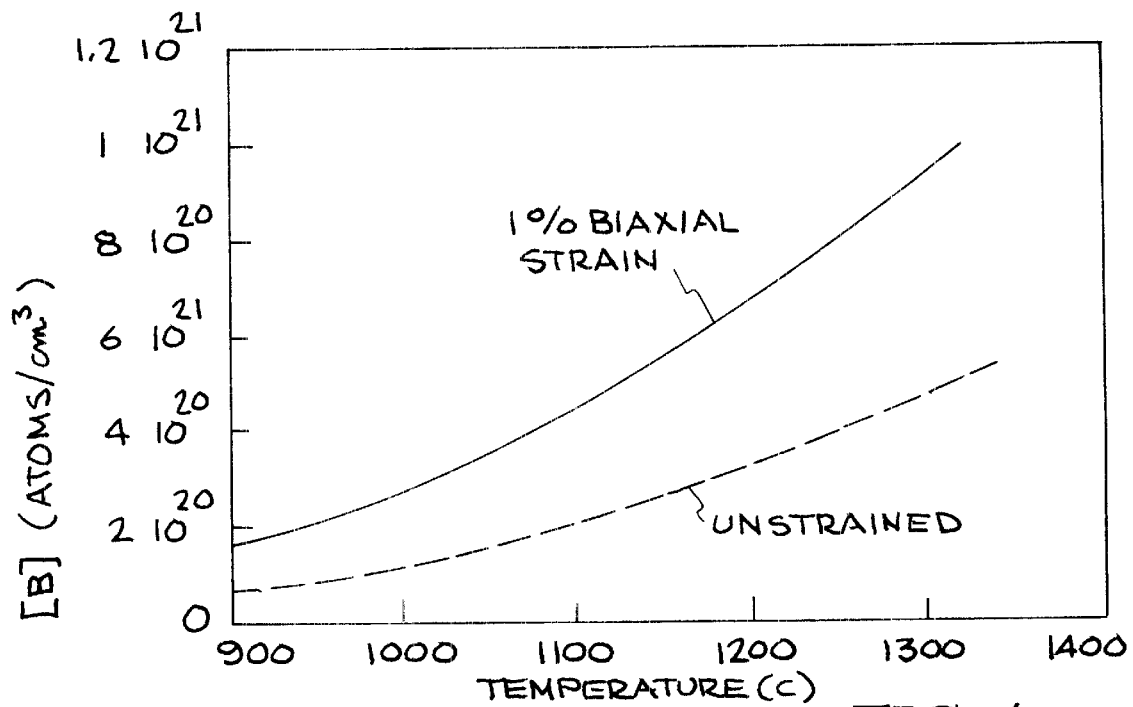
FIG. 4 graphically illustrates boron solubility in 1% biaxially strained silicon and unstrained silicon.

FIG. 3 graphically illustrates boron solubility enhancement at 800° to 1000° C. and FIG. 4 graphically illustrates boron solubility enhancement in silicon due to 1% bi-axial strain compared to enhancement in unstrained silicon.

It has thus been shown that the present invention, which is an improvement over the invention of the above-reference application, involves a method for enhancing the solubility of dopants in semi-conductor materials by the electronic structure of the dopant and the semiconductor (negative or positive charges) and the atom size-mismatch (smaller or larger) of dopant compared to the semiconductor. This invention has been verified using silicon as the semiconductor material and boron (small atom p-type) as the dopant. In addition to boron one may use gallium and indium, as well as n-type dopants such as arsenic, phosphorous, and antimony. Also these predictions are valid for Ge as well as $Si_xGe_{1-x}$ alloys. By this method, the solubility of small atom p-type dopants, such as boron, as well as large atom n-type dopants, such as arsenic, can be raised most effectively by appropriate bi-axial strain. Thus, the solubility of boron, for example, can be increased by 100%, from 1% to 2%, providing a significant advance in the semiconductor field of technology. While the method verification involved boron (B) with silicon, other p-type dopants (preferably small size atoms) as well as n-type dopants (preferably large size atoms) may be with other semiconductors, such as silicon on zinc-sulfite (ZnS) wafers, or silicon on aluminum-phosphate substrate (AlP), or silicon on silicon germanium alloy substrates of different compositions($Si_xGe_{1-x}$), or $Si_xGe_{1-x}$ alloys on silicon, or $Si_xGe_{1-x}$ on ZnS substrate, or $Si_xGe_{1-x}$ on AlP wafer, or $Si_xGe_{1-x}$ film grown on $Si_yGe_{1-y}$ substrate. Here x and y refer to appropriate compositions of the silicon germanium alloys.

One way to produce compressive biaxially strained silicon films is by heterepitaxial growth of silicon on zinc-sulfite (ZnS) substrates. Tensile biaxially strained silicon film can be realized by heteroepitxial growth of silicon on silicon germanium alloys, e.g. $Si_{0.8}Ge_{0.2}$ as well as aluminium phosphate (AlP). Bi-axially strained $Si_xGe_{1-x}$ alloy films can be realized by heteroexitaxy of $Si_xGe_{1-x}$ on $Si_yGe_{1-y}$ substrate. Here x and y refer to appropriate compositions of the silicon germanium alloys. Of course a broad range of other technical ways exist to produce strained semiconductor films.

While particular embodiments, materials, parameters, etc. have been described or illustrated to exemplify and teach the principles of the invention, such are not intended to be limiting. Modifications and changes may become apparent to those skilled in art, and it is intended that the invention be limited only by the scope of the appended claims.

What is claimed is:

1. In a method for enhancing solubility of a dopant in a semiconductor material by applying strain to the material, the improvement including:

determining the electronic structure of the dopant and the semiconductor material, determining the atom size of the dopant and the semiconductor material, and applying a bi-axial strain on the semiconductor material wherein the charge of the dopant is negative and the atom size of the dopant is smaller or larger than the semiconductor material atom size, or the charge of the dopant is positive and the atom size of the dopant is larger than the semiconductor material atom size.

2. The method of claim 1, wherein the dopant having a negative charge and smaller atom size is boron, and the dopant having negative charge and larger atom size is composed of material selected from the group consisting of gallium and indium.

3. The method of claim 1, wherein the dopant having a positive charge and larger atom size, is selected from the group consisting of phosphorous, arsenic, and antimony.

4. A method for enhancing solubility of a dopant in a semiconductor material, comprising:

determining the atom size of the dopant and semiconductor material, determining the charge of the dopant, applying a bi-axial strain on the semiconductor material for enabling enhanced doping of a p-type dopant and small or larger atom size or of an n-type dopant and large atom size.

5. The method of claim 4, wherein the p-type dopant is selected from the group consisting of boron, gallium and indium.

6. The method of claim 1, wherein the n-type dopant is selected from the group consisting of arsenic, phosphorous and antimony.

7. The method of claim 4, wherein the semiconductor material is composed of one of silicon, germanium and silicon germanium alloys.

8. In a method for enhancing solubility of a dopant in silicon by applying bi-axial stress, the improvement comprising:

determining the atom size of the dopant and the silicon-based substrate, determining the electrical charge of the dopant and the silicon, and applying a dopant having a negative charge and smaller or larger atom size than the silicon, or having a positive charge and a larger atom size than the silicon.

9. The improvement of claim 8, wherein the dopant having a negative charge and smaller or larger atom size is selected from the group consisting of boron, gallium and indium.

10. The improvement of claim 8, wherein the dopant having a positive charge and larger atom size is selected from the group consisting of phosphorous, arsenic, and antimony.

* * * * *